(12) United States Patent
Heid

(10) Patent No.: US 6,507,750 B2
(45) Date of Patent: Jan. 14, 2003

(54) METHOD FOR OPERATING A MAGNETIC RESONANCE TOMOGRAPHY APPARATUS, AND MAGNETIC RESONANCE TOMOGRAPHY APPARATUS

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 48 days.

(21) Appl. No.: 09/798,174

(22) Filed: Mar. 2, 2001

(65) Prior Publication Data

US 2001/0031918 A1 Oct. 18, 2001

(30) Foreign Application Priority Data

Mar. 3, 2000 (DE) .......................... 100 10 421

(51) Int. Cl.[7] .................. G01R 33/28; A61B 5/055
(52) U.S. Cl. .............. 600/422; 600/425; 600/428; 324/309; 324/320
(58) Field of Search ................. 600/410, 411, 600/415, 416, 422, 425, 427, 428; 324/313, 309, 319, 320

(56) References Cited

U.S. PATENT DOCUMENTS

| | | | |
|---|---|---|---|
| 3,577,067 A | * 5/1971 | Weaver, Jr. | 324/320 |
| 4,694,836 A | * 9/1987 | Buikman et al. | 600/410 |
| 5,079,503 A | * 1/1992 | Siebold et al. | 324/309 |
| 5,343,148 A | * 8/1994 | Westphal et al. | 324/309 |
| 5,459,401 A | 10/1995 | Kiefer | |
| 5,497,773 A | 3/1996 | Kuhara et al. | |
| 5,955,883 A | 9/1999 | Hennig | |
| 6,100,692 A | * 8/2000 | Petropoulos et al. | 324/309 |
| 6,107,800 A | * 8/2000 | Claasen-Vujcic et al. | 324/319 |
| 6,154,110 A | * 11/2000 | Takeshima | 335/299 |
| 6,169,403 B1 | 1/2001 | Hebrank et al. | |

FOREIGN PATENT DOCUMENTS

DE    OS 42 25 592    2/1994

OTHER PUBLICATIONS

"Concomitant Magnetic Field Gradients and Their Effects on Imaging at Low Magnetic Field Strengths," Norris et al., Magnetic Resonance Imaging, vol. 8, No. 1 (1990), pp. 33–37.

"Pulse and Fourier Transform NMR, Introduction to Theory and Methods," Farrar et al. (1971) pp. 33, 75–76.

"On–line Rechner in der Chemie," Ziessow (1973) pp. 138–143.

* cited by examiner

Primary Examiner—Philip H. Leung
(74) Attorney, Agent, or Firm—Schiff Hardin & Waite

(57) ABSTRACT

In a method for operating a magnetic resonance tomography apparatus, a basic magnetic field is produced and at least one magnetic gradient field is switched that comprises a main field component that is co-linear to the basic magnetic field, having a predetermined main gradient, this gradient field also having at least one accompanying field component that is perpendicular to the main field component, and also having a linearity volume. An additional magnetic field that is as homogenous is possible is thereby switched (activated) that extends beyond the linearity volume, and this additional magnetic field is switched at least for a duration of time in which the gradient field is also switched. This additional magnetic field is oriented such that it reduces at least one of the field components in at least one region of anticipated stimulation of the examination subject.

17 Claims, 5 Drawing Sheets

METHOD FOR OPERATING A MAGNETIC RESONANCE TOMOGRAPHY APPARATUS, AND MAGNETIC RESONANCE TOMOGRAPHY APPARATUS

BACKGROUND OF THE INVENTION

1. Field of the Invention

The present invention relates to a method for operating a magnetic resonance tomography apparatus of the type wherein a basic magnetic field is produced and at least one magnetic gradient field is switched, the gradient field having a main field component that is collinear to the basic magnetic field, forming a predetermined main gradient, the gradient field also being at least one accompanying field component that is perpendicular to the main field component, and also having a linearity volume, as well as a magnetic resonance tomography apparatus for carrying out the method.

2. Description of the Prior Art

Magnetic resonance tomography is a known technique for obtaining images of the interior of a body of a living subject of examination. For this purpose, rapidly switched high-amplitude magnetic gradient fields, produced by a gradient system, are superimposed on a static basic magnetic field that is as homogenous as possible.

The gradient system includes a gradient coil system having gradient coils and a controlled gradient amplifier. One of the gradient coils produces a gradient field for a particular spatial direction; in the desirable ideal case, this gradient field has, at least inside a linearity volume, one main field component that is collinear to the basic magnetic field. The main field component forms a predeterminable main gradient that, at any arbitrary time, and independent of location, is approximately of equal magnitude, at least within the linearity volume. Since the gradient field is a chronologically variable magnetic field, the above holds for each point in time, but from one point in time to the next a strength of the main gradient is variable. The direction of the main gradient is as a rule fixedly predetermined by the design of the gradient coil.

However, based on the basic Maxwell equations, in contrast to the desirable ideal case it is not possible to construct gradient coils that produce exclusively the above-cited main field component over the linearity volume. The main field component is thereby accompanied by at least one accompanying field component that is oriented perpendicular to the main field component and that can—in particular given a main gradient oriented perpendicular to the basic magnetic field—have a gradient-field-type curve having an accompanying gradient that is oriented perpendicular to the main gradient. The above is described in more detail for example in the article by D. G. Norris et al., "Concomitant Magnetic Field Gradients and their Effects on Imaging at Low Magnetic Field Strengths," Magnetic Resonance Imaging, vol. 8, no. 1, 1990, pages 33–37.

For the production of the gradient field, corresponding currents must be set in the gradient coil. The amplitudes of the required currents thereby amount to several 100 A. The current rise and fall rates (slew rate) are several 100 kA/s. For power supply, the gradient coil is connected to a controlled gradient amplifier.

By switching the gradient fields, stimulations can be triggered in a living examination subject during magnetic resonance image exposures. The gradient fields, which thereby act on the examination subject, are characterized by a magnetic flux density that changes over time and that produces eddy currents and induction currents in the subject of examination. The strengths of these electrical currents cited above depends, among other things, on the cross-sectional surface penetrated by the gradient field, and on the chronological change of the gradient field. The above-cited currents thereby flow through regions of the subject of examination that have different electrical conductivity, and thereby effect corresponding electrical voltages. If the voltage thereby exceeds a particular threshold, this results (undesirably) in the triggering of stimulations of the subject of examination. From German OS 42 25 592, it is for example known that given switched gradient fields the highest current or voltage values are induced at the edge or outside the linearity volume, where the field curve of the magnetic flux density of the gradient field is at a maximum, so that there the risk of stimulations is greatest at this location.

In order to avoid stimulations of this sort, it is known for example from German OS 42 25 592 and U.S. Pat. No. 5,497,773 to cover regions outside the linearity volume that are sensitive to stimulation with a closed conductor loop. In addition, it is known from U.S. Pat. No. 5,497,773 to replace the closed conductor loops with coils that can be actively supplied with current. Both the closed conductor loops and also the coils that can be actively supplied with current result in a reduction in the currents induced in the covered region. However, the coverings described above are possible only outside the linearity volume, and are not possible in edge regions of the linearity volume, because otherwise there is an adverse effect on the linearity of the gradient fields in the linearity volume and on the homogeneity of the basic magnetic field, which are important for the image quality. In addition, it is disadvantageous that, given a modification of a region to be imaged of the subject of examination, as a rule the position of the closed conductor loops and of the coils that can be actively supplied with current must also be adapted.

In addition, a method for imitating the electrical stimulations produced by gradient fields is known, for example, from German OS 199 13 547. In this document, among other things it is proposed to avoid stimulations by corresponding limitation of a chronological curve, as well as of a gradient strength, of a gradient field. However, this means that a potential efficiency of a gradient system may not be exploited at all fully.

SUMMARY OF THE INVENTION

An object of the present invention is to provide a method of the type described above for the suppression of stimulations of a subject of examination, as well as an apparatus for the execution of the method, that can be used in variable fashion and that reduces the above-cited disadvantages of the prior art.

With respect to the method, this object is inventively achieved by switching (activating) an additional magnetic field is switched that is as homogenous as possible and that extends beyond the linearity volume, and that is switched at least for a time period in which the gradient field is also switched, and that is oriented such that it reduces at least one of the field components in at least one region in which stimulation is anticipated. With respect to the apparatus for the execution of the method, the object is inventively achieved in a magnetic resonance tomography apparatus comprises an additional coil arrangement for producing the additional magnetic field, or the gradient coil system has a gradient coil for producing the gradient field, and in that the gradient coil is fashioned such that the additional magnetic field and the gradient field can be produced, or in that the apparatus for producing the additional magnetic field has an arrangement for modifying the basic magnetic field.

In this way, a field curve, responsible for stimulation, of at least one of the field components of the gradient field is reduced by the additional magnetic field in the region in which stimulation is anticipated, in order to avoid stimulations. In particular in magnetic resonance examinations of peripheral regions of a living examination subject (for example the head of a patient) there are e.g. two potential maxima of the field curve of the field component of the gradient field, the additional magnetic field reduces that maximum that causes a region of anticipated stimulation inside the subject of examination. This takes place at the expense of increasing the field curve at the second maximum, but this is located outside the subject of examination, and is therefore irrelevant to the stimulation. A region of anticipated stimulation is thereby expected in a region inside a subject of examination in which the magnitude of one of the field components has a maximum.

In an embodiment, the additional magnetic field is collinear to the field component that is to be reduced. In this way, the effect of the additional magnetic field is maximal with respect to the field component that is to be reduced.

In a further embodiment, the additional magnetic field is switched chronologically synchronously with the gradient field. In this way, stimulations are prevented during the entire duration of the examination of a living subject.

In another embodiment, upon each re-polarization (direction change), of the gradient field, the additional magnetic field is correspondingly re-polarization. This causes the additional magnetic field always to be oriented in the region of anticipated stimulation so that it counteracts the field component of the gradient field that is to be reduced, thus avoiding stimulations in the subject.

In an embodiment, at all times a magnitude or absolute value of the magnetic flux density of the additional magnetic field is set proportional to the magnitude of the strength of the main gradient. In this way, the additional magnetic field can be controlled dependent on the gradient field in a particularly simple fashion. It is thereby advantageous that the strength of an accompanying gradient is proportional to the strength of the associated main gradient, and the strength of the main gradient is easily accessible as a controllable quantity of a magnetic resonance tomography apparatus.

In a further embodiment, given a first region of anticipated stimulation in which the additional magnetic field reduces the field component, and given a second region of anticipated stimulation in which the additional magnetic field increases the field component, the magnitude of a magnetic flux density of the additional magnetic field is set such that the regions of anticipated stimulation are subjected equally to stimulation, in a manner corresponding to the respective sensitivity to stimulation of these regions.

In this way, in particular it is also possible to avoid stimulations that are caused in that the subject of examination is positioned in the apparatus in such a way that, for example, a maximum, and a minimum whose magnitude (absolute value) is equal to that of the maximum, of one of the field components of the gradient field produce two regions of anticipated stimulation that are unequally stimulated, for example as a result of the sensitivity of these regions. This is, for example, possible during an examination of an abdominal region of a patient in which the maximum or the minimum produce respective regions of anticipated stimulation in, for example, the breast region or the bone region. Since, for example, the bone region is more sensitive to stimulations than is the breast region, it makes sense to reduce the absolute field stroke in the bone region using the additional magnetic field, and at the same time to accept a larger field curve in the less sensitive breast region, so that stimulations are triggered in neither of the regions. If, in contrast, the two regions of anticipated stimulation identified above have equal sensitivity, the additional magnetic field is to be set equal to zero, and in order to prevent stimulation a strength of the gradient field and/or a switching frequency of the gradient field are possibly reduced. The above-described procedure for intentionally making the gradient field asymmetrical using an additional magnetic field is always set dependent on the position of the examination subject in the apparatus, on the sensitivities of different regions of anticipated stimulation, and on the individual sensitivity to stimulation of a subject of examination.

In another embodiment, the field component to be reduced is a gradient that is collinear to a longitudinal axis of the body of a subject of examination. In this way, in particular given an examination of peripheral regions of the subject of examination, a highly effective suppression of stimulation can be achieved using the additional magnetic field.

DESCRIPTION OF THE PREFERRED EMBODIMENTS

Figure 1:
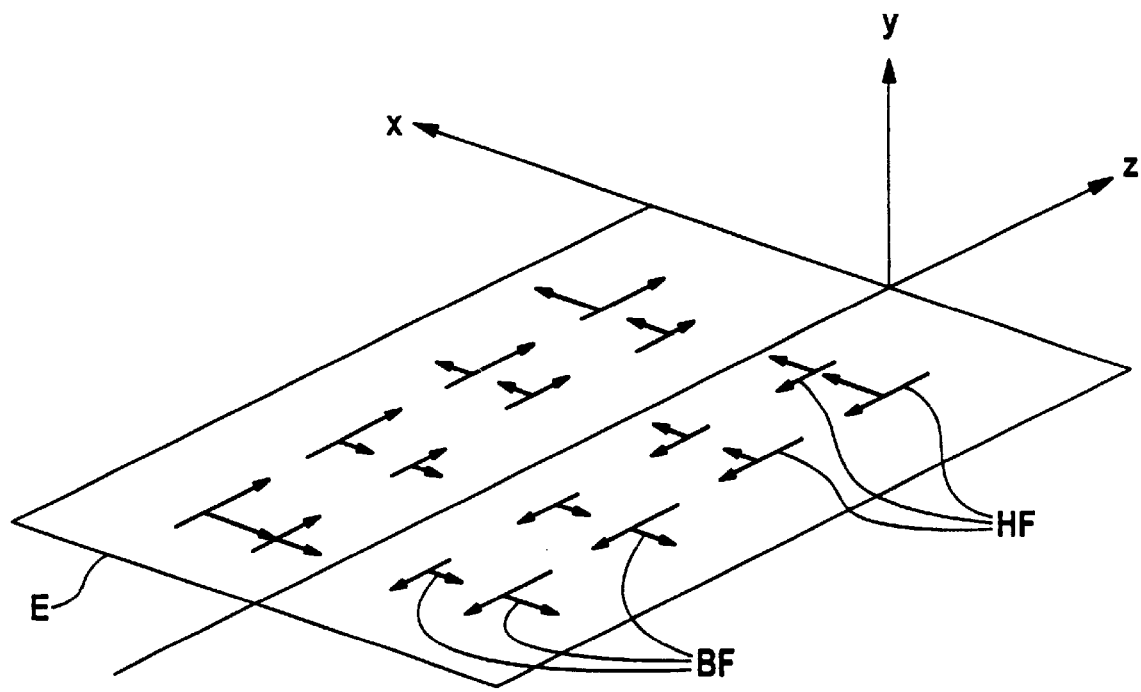
FIG. 1 shows a gradient field containing a main field component and an accompanying field component.

In order to illustrate a gradient field that contains a main field component and an accompanying field component, FIG. 1 shows a mid-plane E of a cylindrical examination chamber of a magnetic resonance tomography apparatus. The gradient field is produced by a gradient coil that is for example a component of a hollow cylindrical gradient coil system of the apparatus and that is constructed in order to produce the gradient field having a main gradient in the x-direction. The basic magnetic field is oriented in the z-direction. The gradient field contains a desired main field component HF that is oriented collinear to the basic magnetic field in the z-direction and that has a desired main gradient in the x-direction. In addition, the gradient field contains an unavoidable accompanying field component BF that is oriented perpendicular to the main field component HF in the x-direction and that has a gradient-field-type curve in the z-direction, with an accompanying field gradient in the z-direction. The comparable situation obtains for a gradient field having a main gradient in the y-direction. A gradient field having a main gradient in the z-direction has accompanying field components in the x and y-directions, whereby the accompanying field components comprise an approximately quadratic dependence on a position in the x- and y-direction.

Without limitation of general validity, in the following only one main field component of a gradient field, having a main gradient oriented in the direction of a basic magnetic field, is considered, for reasons of a simple and easily surveyed representation. The corresponding holds for differently oriented main gradients and/or for accompanying field components.

Figure 2:
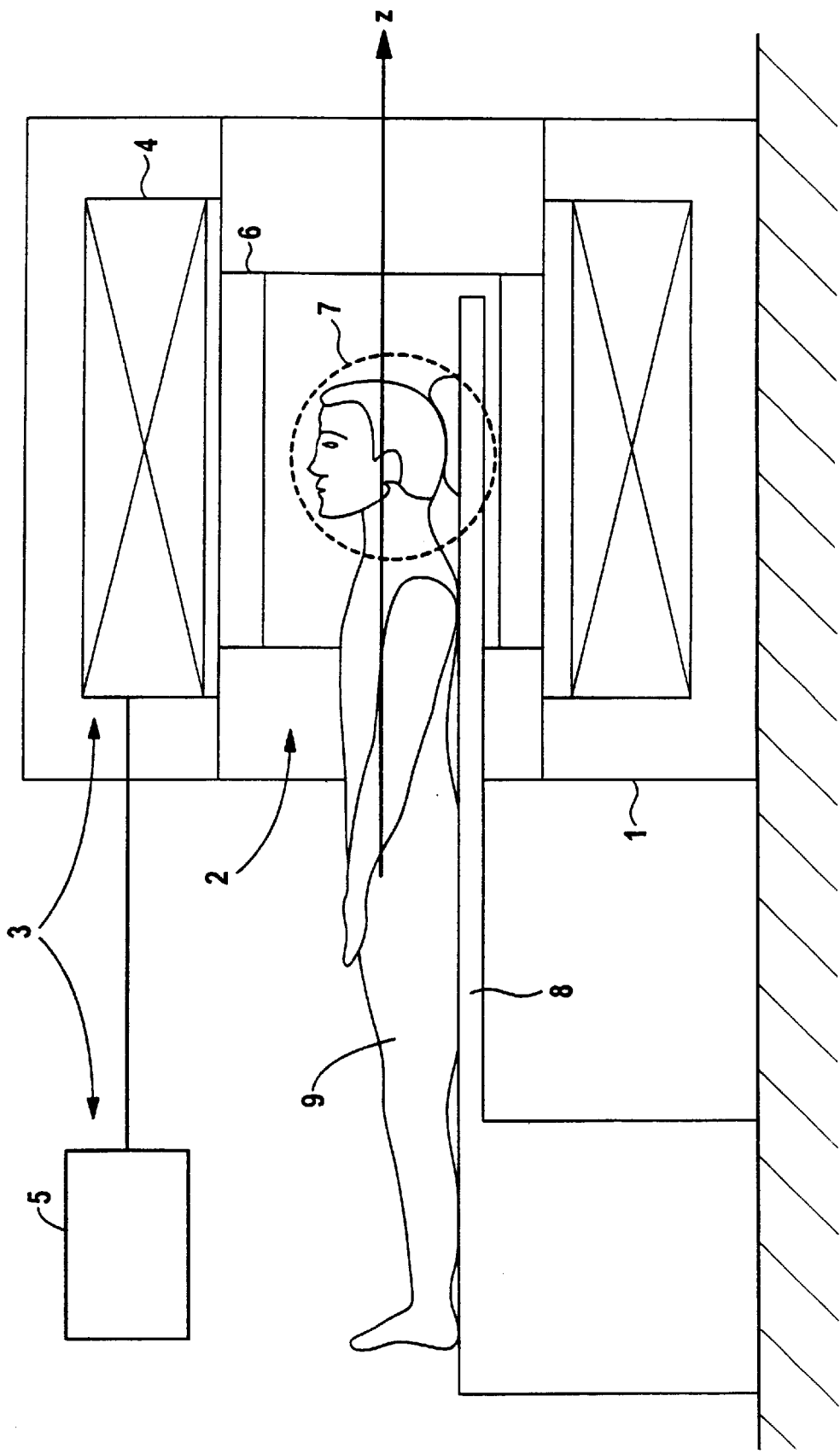
FIG. 2 shows a longitudinal section through a magnetic resonance tomography apparatus.

FIG. 2 shows, as an exemplary embodiment of the invention, a longitudinal section through a magnetic resonance tomography apparatus 1. The apparatus 1 has, in order to produce a basic magnetic field in the direction of a z axis that is as homogenous as possible at least in the examination chamber 2, a controllable basic field magnet system 3 having normal electrical conductivity. This system 3 includes a coil arrangement 4 having normal electrical conductivity and a controllable energy supply apparatus 5 connected with the coil arrangement 4. In addition, for the production of at least one magnetic gradient field comprising a particular linearity volume 7, the apparatus 1 has a gradient coil system 6. In addition, the apparatus 1 contains a movable positioning apparatus 8 on which a subject of examination—in the example shown, a patient 9—is positioned. A region that is to be imaged of the subject of examination—in the example, the head of the patient 9—is thereby positioned in the linearity volume 7 of the apparatus 1.

Figure 3:
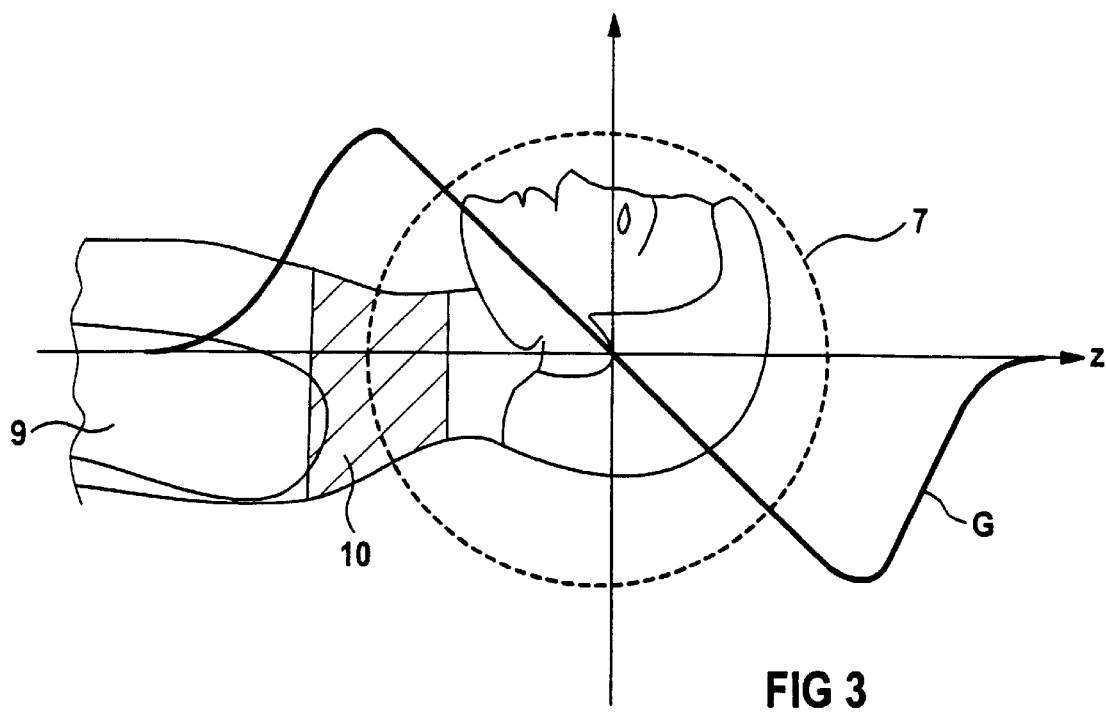
FIG. 3 shows an enlarged segment from FIG. 2, and additionally shows a spatial curve of a gradient field.

FIG. 3 shows an enlargement of a detail from FIG. 2 around the head of the patient 9. For reasons of clarity, parts of the positioning apparatus 8 are thereby not shown. In order to produce magnetic resonance images of the head, gradient fields are switched rapidly. In addition to FIG. 2, at a point in time a curve G of the magnetic flux density B of a main field component HF—oriented in the z-direction—of a gradient field having a main gradient in the z-direction along the z axis is shown. The gradient field curve G produced by the gradient coil system 6 is thereby symmetrical with respect to a midpoint of the linearity volume 7. Given switching of the gradient field, stimulations can be triggered in the body of the patient 9 in particular at the point at which the gradient field curve G comprises its maximum magnitude. As already specified above, this region 10 of anticipated stimulation is outside or, respectively, at the edge of the linearity volume 7, and is characterized in FIG. 3 by hatching.

Figure 4:
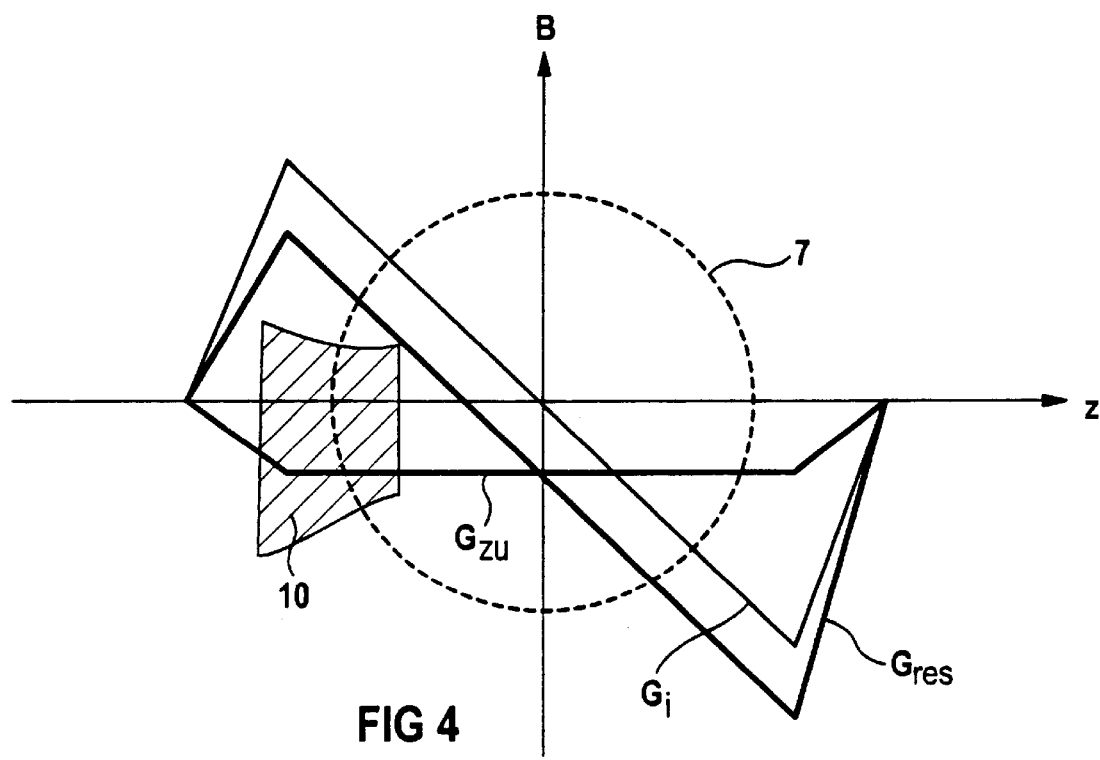
FIG. 4 shows idealized spatial curves of the gradient field from FIG. 3, of an additional magnetic field, and of a gradient field resulting from the above-named fields.

For the gradient field curve G shown in FIG. 3, FIG. 4 shows a corresponding idealized gradient field curve $G_i$. In addition, the idealized curve $G_{zu}$ of an additional magnetic field is shown that extends in as homogenous a manner as possible at least over the linearity volume 7, is switched with the gradient field, is co-linear to the main field component HF, and is oriented such that it reduces the main field component in the region 10 of anticipated stimulation. The additional magnetic field cited above can for example be achieved by a corresponding controlling of the basic magnetic field system 3. Through addition, a curve $G_{res}$ of a resulting gradient field results from the gradient field curve $G_i$ and the curve $G_{zu}$. The maximum field curve of the resulting gradient field does not occur in the region 10 of anticipated stimulation, but rather occurs at a position outside the body of the patient 9, at which no stimulations can be caused. Since the resulting gradient field has the consequence of a reduced magnetic flux density in comparison with the gradient field in the region of anticipated stimulation, stimulations in the region of anticipated stimulation can be avoided with certainty in this manner. The effect of the additional magnetic field on the magnetic resonance signals is, for example, compensated by an additional controlling, in the same direction of a high frequency system of the apparatus 1.

In a magnetic resonance examination of an abdominal region of the patient 9, in which the patient 9 is correspondingly positioned with his abdomen in the linearity volume 7, the above-cited additional magnetic field for the suppression of stimulations makes sense only if the two maxima (with respect to magnitude) of the gradient field stimulate the patient 9 unequally. As a rule, a displacement repositioning of the locus of the maximum field curve of the gradient field to a point outside the body of the patient 9 cannot be carried out during an examination of the abdomen. However, the above-described locus can be moved to a point inside the body having lower sensitivity with respect to stimulations.

Figure 5:
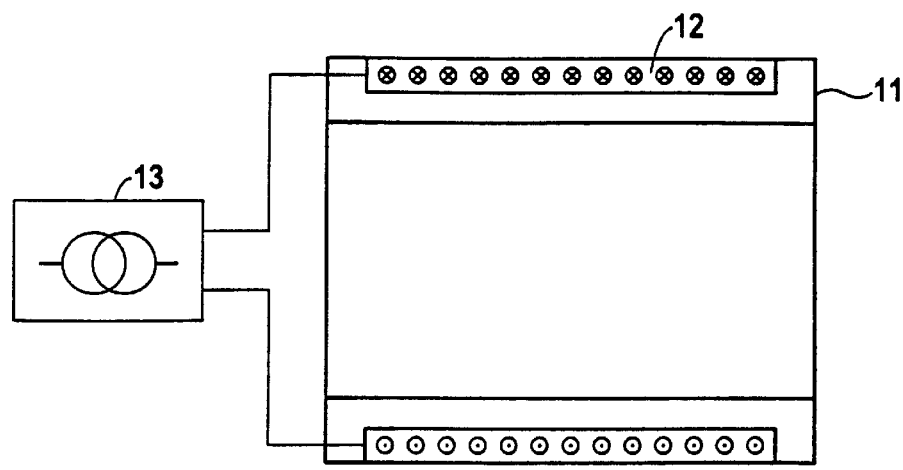
FIG. 5 shows a gradient coil system that has an additional coil arrangement that is connected with a controllable power supply apparatus.
Figure 6:
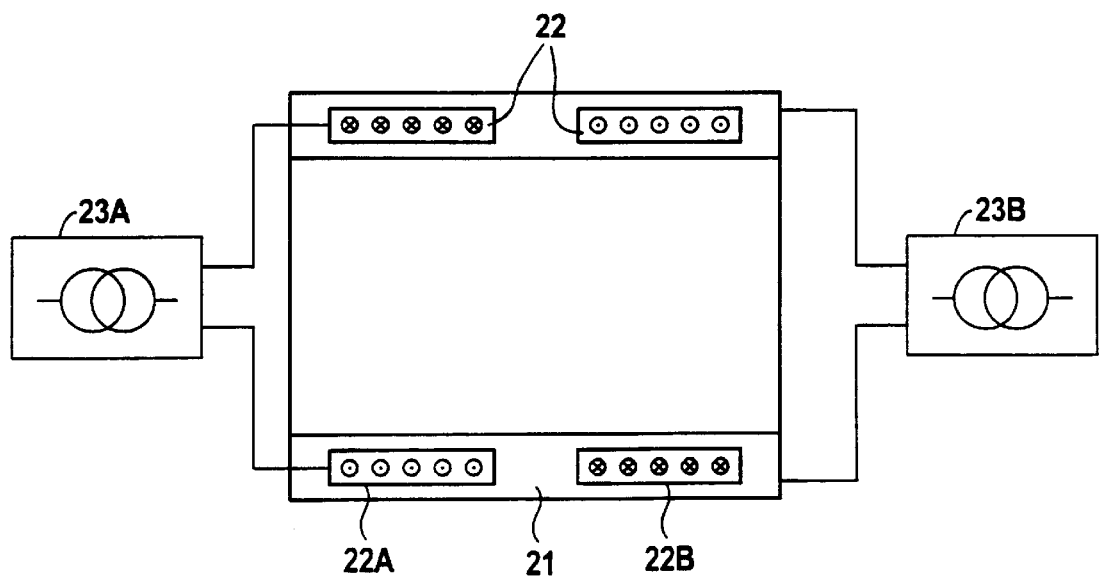
FIG. 6 shows a gradient coil system having a gradient coil that has two partial coils that can be driven independently of one another.

In FIGS. 5 and 6, in additional specific embodiments of the invention apparatuses are shown for the production of an additional magnetic field. These apparatuses can for example be used in magnetic resonance tomography apparatuses that do not, as specified in FIG. 2, have a basic field magnet system 3 having normal electrical conductivity, but rather having for example a superconducting basic field magnet system, in which a production of the additional magnetic field by the basic field magnet system would be very expensive and cost-intensive, if possible at all.

FIG. 5 shows a longitudinal section through a hollow cylindrical gradient coil system 11. The gradient coil system 11 thereby contains an additional coil arrangement 12 for producing the additional magnetic field. For clarity, a representation of additional components of the gradient coil system 11, such as gradient coil arrangements, has been omitted. In order to control a current in the additional coil arrangement 12, the additional coil arrangement 12 is connected with a controllable power supply apparatus 13.

FIG. 6 shows a longitudinal section through a hollow cylindrical gradient coil system 21 that comprises a gradient coil 22 for producing a gradient field. The gradient coil 22 is thereby fashioned such that the additional magnetic field and the gradient field can be produced. As in FIG. 5, for clarity a representation of additional components of the gradient coil system 21, for example additional gradient coil arrangements, has been omitted. For the production both of the additional field and the gradient field, the gradient coil 22 has two partial coils 22A and 22B that can be controlled independently of one another. Each of the partial coils 22A and 22B is thereby connected with a respective controllable power supply apparatus 23A and 23B, so that the currents in the two partial coils 22A and 22B can be adjusted independently of one another.

Figure 7:
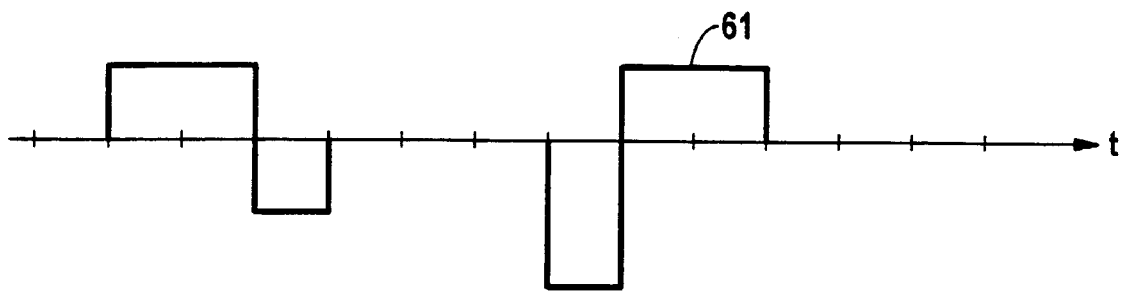
FIG. 7 shows an idealized chronological curve of a gradient strength of a gradient field.

FIG. 7 shows an idealized chronological curve 61 of a gradient strength of a gradient field during the switching of the gradient field in the context of a magnetic resonance examination.

Figure 8:
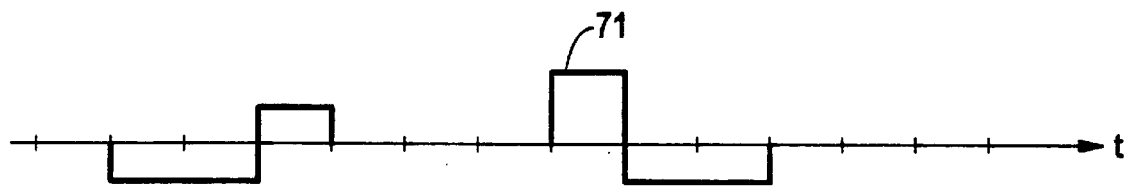
FIG. 8 shows a chronological curve, associated with FIG. 7, of a magnetic flux density of an additional magnetic field.

FIG. 8 shows a chronological curve 71, associated with FIG. 7, of a magnetic field strength of an additional magnetic field. The additional magnetic field is thereby switched such that in a region of anticipated stimulation it counteracts the gradient field. Given a re-polarization of the gradient field, the additional magnetic field is thereby correspondingly also re-polarized. In addition, the additional magnetic field is adjusted, in the context of a simple controlling, such that at all times a magnitude or absolute value of the magnetic flux density of the additional magnetic field is proportional to the magnitude of the main gradient strength of the gradient field.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance tomography apparatus comprising the steps of:
   generating a basic magnetic field in which a living subject is exposed;
   generating a switched gradient magnetic field, in which said subject also is disposed, having a main field component that is co-linear with said basic magnetic field and having a predetermined main gradient and at least one accompanying field component perpendicular to said main field component, and having a linearity volume, said subject being susceptible to stimulation by said switched gradient field; and
   generating a substantially homogenous additional magnetic field extending beyond said linearity volume, switched with said switched gradient magnetic field, and orienting said additional magnetic field so that, in a region of an examination subject in which said stimulation by said switched gradient magnetic field is expected, said additional magnetic field reduces at least one of said main field component and said accompanying field component of said gradient magnetic field.

2. A method as claimed in claim 1 comprising orienting said additional magnetic field to be co-linear to one of said field components which is to be reduced.

3. A method as claimed in claim 1 comprising generating said additional magnetic field chronologically in synchronism with generating said switched gradient field.

4. A method as claimed in claim 1 comprising depolarizing said switched gradient magnetic field, and correspondingly repolarizing said additional magnetic field.

5. A method as claimed in claim 1 comprising, at each point in time, setting a magnitude of a magnetic flux density of the additional magnetic field proportionally relative to a magnitude of a strength of said main field component.

6. A method as claimed in claim 1 wherein, in a first region of expected stimulation in which said additional magnetic field reduces said one of said components, and in a second region of expected stimulation in which said additional magnetic field increases said one of said field components, adjusting a magnitude of a flux density of the additional magnetic field such that an equal exposure to stimulation is produced in each of said regions, dependent on a sensitivity to stimulation in the respective regions of the examination subject.

7. A method as claimed in claim 1 wherein one of said components to be reduced by said additional magnetic field is a gradient that is co-linear to a longitudinal axis of a body of an examination subject.

8. A method as claimed in claim 1 wherein said predetermined main gradient has a direction co-linear to said basic magnetic field, and wherein the step of reducing one said field components comprises reducing said main field component.

9. A method as claimed in claim 1 wherein said predetermined main gradient has a direction perpendicular to said basic magnetic field, and wherein the step of reducing one said field components comprises reducing said accompanying field component.

10. A magnetic resonance tomography apparatus comprising:
    a basic field magnetic system for producing a basic magnetic field in a volume adapted to receive a living subject;
    a gradient coil system for generating at least one switched gradient magnetic field adapted to interact with said subject and thereby make said subject susceptible to stimulation by said switched gradient field, having a main field component co-linear to said basic magnetic field and a predetermined main gradient, and at least one accompanying field component perpendicular to said main field component, and having a linearity volume; and
    an additional coil arrangement for generating a substantially homogenous additional magnetic field which extends beyond said linearity volume, switched with said switched gradient magnetic field, and which orients said additional magnetic field so that, in a region of anticipated stimulation by said switched gradient magnetic field in said subject, said additional magnetic field reduces at least one of said field components of said switched gradient magnetic field.

11. A magnetic resonance tomography apparatus as claimed in claim 10 wherein said additional coil arrangement is disposed inside said gradient coil system.

12. A magnetic resonance tomography apparatus as claimed in claim 11 further comprising a controllable power supply connected to said additional coil arrangement for operating said additional coil arrangement.

13. A magnetic resonance tomography apparatus as claimed in claim 10 wherein said additional coil arrangement comprises and additional coil in said gradient coil system, said gradient-system having a separate gradient coil for producing said gradient magnetic field.

14. A magnetic resonance tomography apparatus as claimed in claim 13 wherein said gradient coil comprises at least two partial coils which are independently controllable.

15. A magnetic resonance tomography apparatus as claimed in claim 14 wherein said partial coils have respective currents flowing therein which are set by said independent control to produce said additional magnetic field and said gradient field.

16. A magnetic resonance tomography apparatus comprising:
    a basic field magnetic system for producing a basic magnetic field in a volume adapted to receive a living subject;
    a gradient coil system for generating at least one switched gradient magnetic field adapted to interact with said subject and thereby make said subject susceptible to stimulation by said switched gradient filed, having a main field component co-linear to said basic magnetic field and a predetermined main gradient, and at least one accompanying field component perpendicular to said main field component, and having a linearity volume; and
    a control unit for said basic field magnet for modifying said basic magnetic field for generating a substantially homogenous additional magnetic field which extends beyond said linearity volume, switched with said switched gradient magnetic field, and which orients said additional magnetic field so that, in a region of anticipated stimulation by said switched gradient magnetic field in said subject, said additional magnetic field reduces at least one of said field components of said switched gradient magnetic field.

17. A magnetic resonance tomography apparatus as claimed in claim 16 wherein said basic field magnet system comprises a controllable, normally conducting magnet system.

* * * * *